United States Patent (10) Patent No.: US 6,882,541 B2
Maruyama et al. (45) Date of Patent: Apr. 19, 2005

(54) IC CARD

(75) Inventors: Terutaka Maruyama, Toyota (JP); Mitsuru Nakagawa, Chiryu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/795,425

(22) Filed: Mar. 9, 2004

(65) Prior Publication Data

US 2004/0190267 A1 Sep. 30, 2004

(30) Foreign Application Priority Data

Mar. 27, 2003 (JP) ........................................ 2003-087207

(51) Int. Cl.⁷ ............................ H05K 1/14; H05K 5/02
(52) U.S. Cl. ...................... 361/752; 361/737; 361/749; 174/254; 174/52.4; 235/492
(58) Field of Search ................................. 361/737, 748, 361/749, 752, 760, 736; 174/50, 52.2, 250, 254, 255, 260, 52.4; 235/492

(56) References Cited

U.S. PATENT DOCUMENTS 5,117,282 A * 5/1992 Salatino ...................... 257/686
5,121,297 A * 6/1992 Haas ........................... 361/751
5,448,511 A * 9/1995 Paurus et al. .................. 365/52
5,491,612 A * 2/1996 Nicewarner, Jr. ............ 361/760
5,612,513 A * 3/1997 Tuttle et al. ................. 174/260
5,717,556 A * 2/1998 Yanagida ..................... 361/803
5,822,194 A * 10/1998 Horiba et al. ................ 361/760
6,665,191 B1 * 12/2003 Blood et al. ................. 361/749
2001/0050846 A1 * 12/2001 Cho ............................ 361/784

FOREIGN PATENT DOCUMENTS

JP         A-8-197878           8/1996

* cited by examiner

Primary Examiner—Kamand Cuneo
Assistant Examiner—Dameon E. Levi
(74) Attorney, Agent, or Firm—Posz Law Group, PLC

(57) ABSTRACT

Of an IC card, an IC is mounted on a surface of a circuit board (FPC) including a hard plate member that is attached on the other surface of the circuit board. Both surfaces of the circuit board having the IC and plate member are covered by a hard material member of electric insulating. Therefore, stress load applied to the IC can be restricted. Further, the circuit board along with the hard material member is divided into multiple portions that are connected using a flexible electric wiring. This can provide sufficient flexibility to the IC card, resulting in enhancement of a preventive effect in breakage or damage of the IC card.

11 Claims, 2 Drawing Sheets

IC CARD

CROSS REFERENCE TO RELATED APPLICATIONS

This application is based on and incorporates herein by reference Japanese Patent Application No. 2003-87207 filed on Mar. 27, 2003.

FIELD OF THE INVENTION

The present invention relates to an IC card that contains an integrated circuit (IC).

BACKGROUND OF THE INVENTION

In a typical integrated circuits (IC) card, an integrated circuit (IC) is mounted on a circuit board, and the circuit board is contained together with the IC within a card-shape framed body. The framed body made of a hard resin prevents the IC card and circuit board from suffering external bending stress, decreasing stress load applied to the IC card and circuit board (refer to JP-A-H8-197878). Here, flexibility of the IC card is generated by the framed body having two crossed grooves and by the circuit board formed of a hard material such as a glass epoxy board. This restricts the external bending stress applied to the framed body, circuit board, and brittle IC, preventing the breakage or damage of the circuit board, framed body, or the damage of the IC. For instance, the external bending stress applied to the IC card is generated when a user having an IC card in his hip pocket takes a seat.

However, the above structured IC card has a structure where the hard framed body and circuit board exist over the entire surface of the IC card. Even with the grooves formed on the circuit board or on the framed body, an effect of providing the flexibility to the IC card is limited. The above mentioned breakage or damage cannot be thereby sufficiently restricted.

SUMMARY OF THE INVENTION

It is an object of the present invention to decrease stress applied to a circuit board and IC of an IC card and enhance a preventive effect in damaging or breaking the IC card.

To achieve the above object, an IC card having a card shape is provided with the following. An IC is mounted on a circuit board. The IC and the circuit board are covered by a hard material member. Here, the circuit board along with the hard material member is divided into a plurality of portions, and the portions are connected using a flexible electric wiring. This structure of an IC card provides a flexibility property to an IC card in comparison with a structure of an IC card where a hard material framed body or a circuit board exists over the entire surface of the IC card. This results in enhancing a preventive effect in breakage or damage of the IC card.

In another aspect of the present invention, an IC card is provided with the following. The IC card includes a first card portion of a card shape and a second card portion of a card shape. The first card portion includes an IC, a circuit board where the IC is mounted, and a hard material member covering the IC and the circuit board. The second card portion includes no circuit. Here, the first card portion and second card portion are disposed on a same plane, and mechanically connected using a soft material member. This structure also provides a flexibility property to an IC card in comparison with a structure of an IC card where a hard material framed body or a circuit board exists over the entire surface of the IC card. This results in enhancing a preventive effect in breakage or damage of the IC card.

BRIEF DESCRIPTION OF THE DRAWINGS

The above and other objects, features, and advantages of the present invention will become more apparent from the following detailed description made with reference to the accompanying drawings. In the drawings.

DETAILED DESCRIPTION OF THE PREFERRED EMBODIMENTS (First Embodiment)

Figure 1:
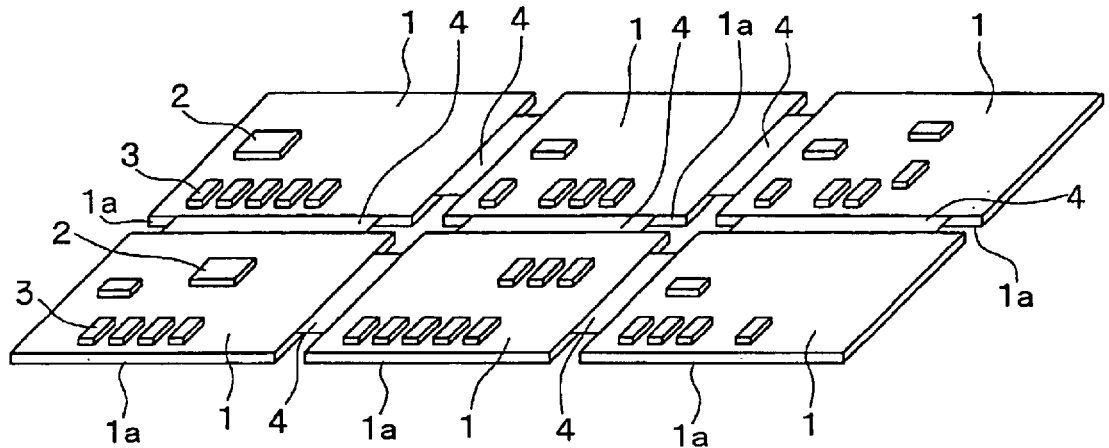
FIG. 1 is a perspective view of an internal structure of an IC card according to a first embodiment of the present invention.
Figure 2:
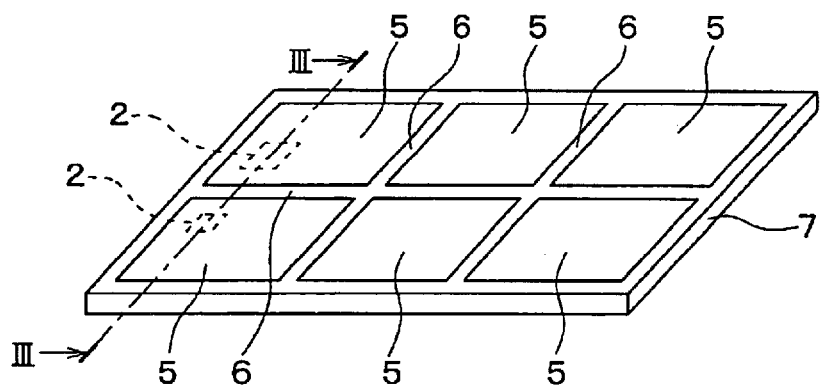
FIG. 2 is an external view of the IC card according to the first embodiment.

An internal structure of an IC card according to a first embodiment of the present invention is shown in FIG. 1. The IC card contains a circuit board 1 that uses a flexible printed wiring circuit board (FPC). The FPC is constructed of an insulating film such as a polyamide film or polyester film where a wiring pattern is formed.

On the circuit board 1, an integrated circuit (IC) 2 and other electronic components 3 are mounted. The IC 2 and components 3 are mounted on a single (top) surface of the circuit board 1; however, they can be mounted on the both (top and bottom) surfaces of the circuit board 1.

Figure 3:
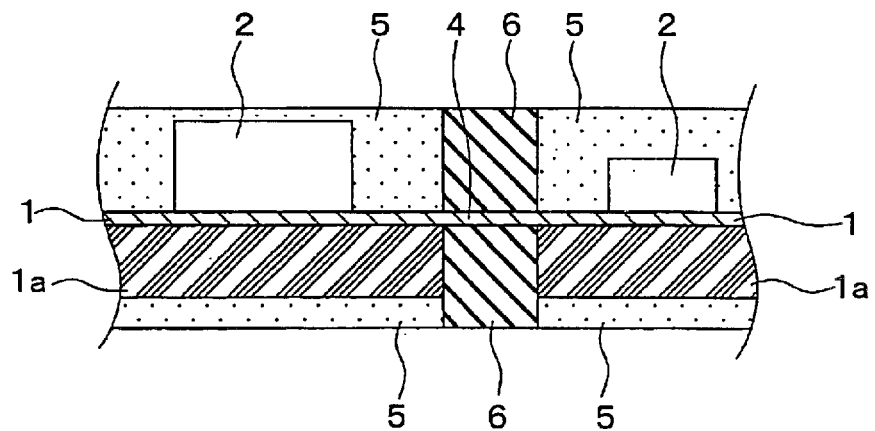
FIG. 3 is a sectional view taken along Line III—III in FIG. 2.

On the bottom surface of the circuit board 1, an electric insulating plate member 1a that is harder than the FPC is attached (refer to FIG. 3). The plate member 1a prevents the circuit board 1 from being elastically deformed when the IC 2 is mounted on the circuit board 1. The plate member 1a includes an epoxy board with glass fibers.

Further, in another aspect of the present invention, the plate member 1a can be eliminated. In detail, an IC can be mounted on a circuit board 1 that is temporarily put on a pedestal (not shown). Furthermore, when a hard material such as a glass epoxy board is used for a circuit board 1, the plate member 1a can be eliminated.

The circuit board 1 having the IC 2 or components 3 is divided into the multiple portions so that the multiple portions are arranged on the same plane as shown in FIG. 1. Further, the dividing lines forming the portions of the circuit board 1 avoid the positions of the ICs 2 and components 3. In this embodiment, the circuit board 1 is divided into the six portions, so that each portion is quadrate or rectangular.

The multiple portions of the circuit board 1 are electrically connected via flexible electric wirings 4. In this embodiment, the electric wirings 4 are formed of the FPC similarly with the circuit board 1. However, the electric wirings 4 can be formed of a cable such as a known flat cable.

The circuit board 1 including the IC 2 and components 3 is covered by an electric insulating hard material member 5, while the electric wirings 4 are covered by a soft material member 6. Namely, the hard material member 5 is also divided into the multiple portions as well as the circuit board 1.

The hard material member 5 can be formed of a thermo plastic resin or thermosetting resin such as an epoxy resin or polycarbonate. The soft material member 6 can preferably use a rubber such as a thermo plastic elastomer rubber or silicon rubber. The hard material member 5 and soft material member 6 are formed as being closely contacted with each other.

Forming method for the hard material member 5 will be explained below. When the hard material member 5 uses an epoxy resin or the like, a known potting forming method is used. Here, a two-liquid resin is poured, in a vacuum condition, into a certain mold containing the circuit board 1, so that the liquid resin is then solidified.

By contrast, when the hard material member 5 uses a polycarbonate or the like, a known injection mold forming method is used. Here, a liquid resin is injected into a certain mold containing the circuit board 1, so that the liquid resin is then solidified.

Further, with respect to forming method for the soft material member 6, when the soft material member 6 uses a silicon rubber or the like, a known potting forming method is used. By contrast, when the soft material member 6 uses a thermo plastic elastomer rubber or the like, a known injection mold forming method is used. In addition, the hard material member 5 and soft material member 6 are favorably formed as having different individual colors.

The peripheral brim of the IC card 1 is formed of a soft material member 7, enhancing impact resistance of the IC card 1. The material of the soft material member 7 is the same as that of the soft material member 6, so that both the soft material member 7 and the soft material member 6 are formed as being integrated.

Further, the IC card 1 is favorably not more than 5 mm thick. In this embodiment, the soft material members 6, 7 are approximately 3 mm wide so that the IC card 1 is approximately 86 mm×approximately 54 mm.

As explained above, in this embodiment, the circuit board 1 including the IC 2 and the plate member 1a is covered in its both surfaces by a hard material member 5. This restricts direct application of the external bending stress on the plate member 1a and IC 2, enabling decrease of stress load applied to the plate member 1a and the IC 2.

Further, the circuit board 1 including the hard plate member 1a along with the hard material member 5 is divided into the multiple portions. These multiply divided portions of the circuit board 1 are connected via the flexible electric wirings 4, providing sufficient flexibility to the IC card. This enables enhancement of a preventive effect in the breakage or damage of the IC card.

In this embodiment, the soft material member 6 is disposed between the divided portions of the hard material member 5, so that the impact resistance of the IC card is enhanced.

Furthermore, the hard material member 6 is formed by the injection mold forming or the potting forming method, so that the hard material member 5 is closely contacted with the circuit board 1 and the ICs 2. This enhances a water proofing property of the circuit board 1 and the ICs 2.

(Second Embodiment)

Figure 4:
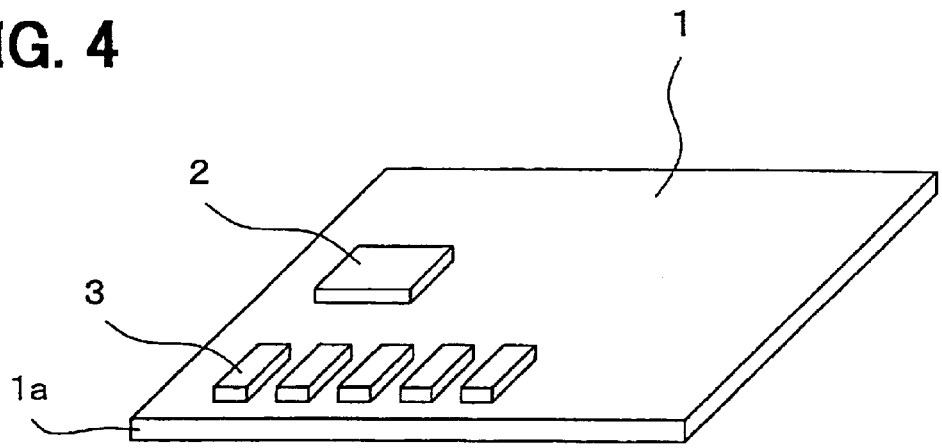
FIG. 4 is a perspective view of an internal structure of an IC card according to a second embodiment of the present invention.
Figure 5:
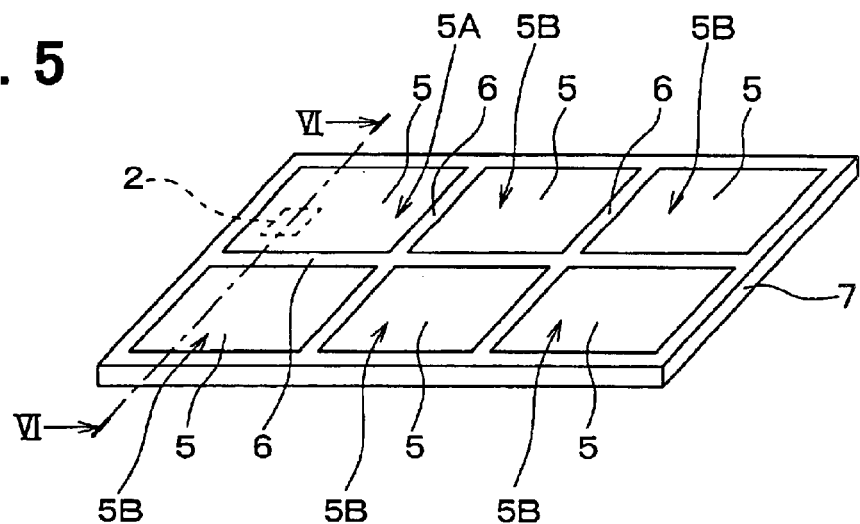
FIG. 5 is an external view of the IC card according to the second embodiment.

A difference from the first embodiment will be explained with reference to FIGS. 4 to 6. In the first embodiment, the multiple portions of a circuit board 1 are included in an IC card 1. In a second embodiment, only a single circuit board 1 is included in an IC card as one of the multiple portions of an IC card, as shown in FIG. 4. Namely, as shown in FIGS. 5, 6, the IC card includes a single circuit-built-in card portion 5A having a circuit board 1 and IC 2, and multiple no-circuit-built-in card portions 5B having neither circuit 1 nor IC 2.

Figure 6:
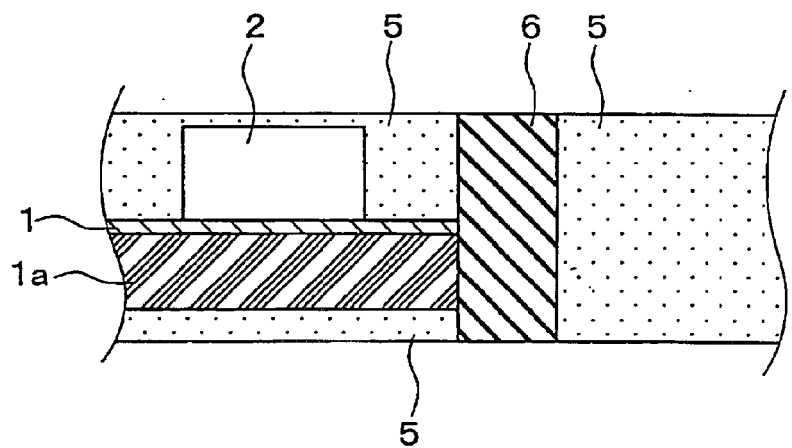
FIG. 6 is a sectional view taken along Line VI—VI in FIG. 5.

In a sectional view shown in FIG. 6, the circuit-built-in card portion 5A has the same structure of that of the first embodiment. Here, an electric insulating hard material member 5 covers the both surfaces of a circuit board 1 where an IC 2 is mounted and a plate member 1a is attached, so as to form a card-shape portion 5A. By contrast, the no-circuit-built-in card portion 5B is formed of only a hard material member 5 so as to form a card-shape portion 5B. Both the card portions 5A, 5B are mechanically connected each other using a soft material member 6.

As explained above, in the second embodiment, the both surfaces of the circuit board including the IC 2 is covered by the hard material member 5. This restricts direct application of the external bending stress on the plate member 1a and IC 2, enabling decrease of stress load applied to the plate member 1a and the IC 2.

Further, a circuit-built-in card portion 5A containing a circuit board 1 attached to a hard plate member 1a, and a no-circuit-built-in card portion 5B are separately provided. Both the card portions 5A, 5B are mechanically connected using a soft material member 6, providing a flexibility property to an IC card. This results in enhancement of a preventive effect in the breakage or the damage of the IC card.

(Other Modifications)

The present invention can be directed to IC cards used in various applications. In particular, it can be preferably applicable to an IC card communicating with a vehicle via a wireless communications method, e.g, an IC card used for manipulating an ON or OFF state of a door-lock of a vehicle using a wireless communications method. Further, the present invention can be directed to an IC card for communicating with a public phone.

Furthermore, an IC card accommodating an antenna or a built-in battery within its hard material member 5 or soft material member 6, 7 can favorably utilize a structure provided by the present invention. In addition, the present invention can be directed to an IC card capable of being remotely (contactless) power-charged owing to a built-in secondary coil for generating an inductive electromotive force, without the built-in battery.

In the first embodiment, an electric wiring 4 is covered by a soft material member 6; however, the electric wiring 4 is being exposed without being covered by the soft material member 6.

In the first embodiment, the circuit board 1 and an electric wiring 4 are formed as being integrated using a FPC; however, the circuit board 1 and the electric wiring 4 can be separately formed.

In the first and second embodiments, as shown in FIGS. 3, 6, a hard material member 5 and a soft material member 6 contact or face mutually through both the flat surfaces; however, both can be connected as being engaging with each other. This enables increase of favorable fixation between the hard material member 5 and the soft material member 6.

Yet further, in the first and second embodiments, an IC card can be enhanced in its design. Namely, a flexible film having a printed design is attached on the both surfaces of a hard material member 5, a soft material member 6, and a soft material member 7. Furthermore, printing can be directly applied on both surfaces of the hard material member 5, soft material member 6, and soft material member 7.

It will be obvious to those skilled in the art that various changes may be made in the above-described embodiments of the present invention. However, the scope of the present invention should be determined by the following claims.

What is claimed is:

1. An IC card having a card shape, comprising:

an IC;

a circuit board where the IC is mounted; and a hard material member covering an entire top surface and an entire bottom surface of the IC and the circuit board, wherein the circuit board along with the hard material member is divided into a plurality of portions so that a first at least two of the plurality of portions are laterally arranged on a same plane and a second at least two of the plurality of portions are longitudinally arranged on the same plane, wherein the portions are connected using a flexible electric wiring, the flexible electric wiring covered by a soft material member.

2. The IC card of claim 1, wherein the electric wiring is covered by the soft material member being electrically insulating.

3. The IC card of claim 2, wherein the soft material member is formed by filling, with a liquid filling material, a given mold in which the plurality of portions being connected using the electric wiring is inserted and by then solidifying the liquid filling material, wherein the filling material includes at least one of an elastic resin and a rubber.

4. The IC card of claim 1, wherein the electric wiring includes a flexible printed wiring circuit board.

5. The IC card of claim 4, wherein the circuit board includes a flexible printed wiring circuit board, and wherein the circuit board and the electric wiring are formed as being integrated.

6. The IC card of claim 1, wherein the circuit board includes a flexible printed wiring circuit board.

7. The IC card of claim 1, wherein the hard material member is formed by filling, with a liquid resin, a certain mold in which the circuit board is inserted and by then solidifying the liquid resin.

8. An IC card including a plurality of card portions, the IC card comprising:

at least one first card portion included in the plurality of card portions, the at least one first card portion including:

an IC, a circuit board where the IC is mounted, and a hard material member covering an entire top surface and an entire bottom surface of the IC and the circuit board;

at least one second card portion included in the plurality of card portions, the at least one second card portion having no circuit, wherein a first at least two of the plurality of card portions are laterally arranged on a same plane and a second at least two of the plurality of card portions are longitudinally arranged on the same plane; and a soft material member using which the card portions are mechanically connected.

9. The IC card of claim 8, wherein the circuit board includes a flexible printed wiring circuit board.

10. The IC card of claim 8, wherein the hard material member is formed by filling, with a liquid resin, a certain mold in which the circuit board is inserted and by then solidifying the liquid resin.

11. The IC card of claim 1, wherein a certain portion within the plurality of portions is connected with at least two adjoining portions within the plurality of portions on at least two adjoining sides of the certain portion using the flexible electric wiring.

* * * * *